United States Patent
Chung (10) Patent No.: US 8,638,137 B2
(45) Date of Patent: Jan. 28, 2014

(54) DELAY LOCKED LOOP

(75) Inventor: Jin Il Chung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/448,547

(22) Filed: Apr. 17, 2012

(65) Prior Publication Data

US 2013/0002322 A1 Jan. 3, 2013

(30) Foreign Application Priority Data

Jun. 29, 2011 (KR) .......................... 10-2011-0063779

(51) Int. Cl.
*H03L 7/06* (2006.01)

(52) U.S. Cl.
USPC ............ 327/149; 327/152; 327/153; 713/401

(58) Field of Classification Search
USPC ........... 327/149, 152, 153, 158, 161; 713/401
See application file for complete search history.

(56) References Cited

U.S. PATENT DOCUMENTS

| 6,404,248 | B1 * | 6/2002 | Yoneda ........................ 327/158 |
| 6,539,072 | B1 * | 3/2003 | Donnelly et al. ............. 375/371 |
| 6,937,077 | B2 * | 8/2005 | Zarate et al. .................. 327/158 |
| 6,943,602 | B1 * | 9/2005 | Lee ............................... 327/158 |
| 7,375,565 | B2 * | 5/2008 | Kwak ........................... 327/158 |
| 2007/0001724 | A1 * | 1/2007 | Na ................................ 327/158 |

* cited by examiner

*Primary Examiner* — William Hernandez
(74) *Attorney, Agent, or Firm* — IP & T Group LLP (57) ABSTRACT

A semiconductor device includes a delay unit configured to delay an inputted clock to generate a delay clock, a selection unit configured to select and output one of the inputted clock and the delay clock, a delay locked loop configured to perform a delay locking operation using a signal delivered from the selection unit, and a selection control unit configured to control the selection unit in response to a comparison of one period of the inputted clock and a maximum delay value of the delay locked loop.

12 Claims, 7 Drawing Sheets

DELAY LOCKED LOOP

CROSS-REFERENCE(S) TO RELATED APPLICATIONS

The present application claims priority of Korean Patent Application No. 10-2011-0063779, filed on Jun. 29, 2011, which is incorporated herein by reference in its entirety.

BACKGROUND OF THE INVENTION

The present invention relates to a semiconductor integrated circuit, and more particularly to a delay locked loop (DLL) included in a semiconductor memory device.

In a system including semiconductor devices, a semiconductor memory device serves for storing data or information. When a data processor such as a CPU requests for information, the semiconductor memory device outputs data in response to an address inputted from the data processor or any other device requesting the data, or stores data, provided by a data processor, in specific internal locations corresponding to an address.

As operation speed of the system becomes faster as semiconductor integrated circuits are being advanced, a semiconductor memory device outputs or stores data at a higher operation speed. To input and output data at high speed, a synchronous memory device receives an system clock and inputs and outputs data in synchronization with the inputted system clock. To overcome limitations of prior synchronous memory devices, a double data rate (DDR) synchronous memory device, which inputs or outputs data at rising and falling edges of the system clock, is being developed.

Here, the DDR synchronous memory device processes two data within one cycle of the system clock by inputting and outputting data at each of the rising and the falling edges of the system clock. In operation, timings of outputting data from the DDR synchronous memory device are synchronized with the rising or the falling edge of the system clock. Here, a data output circuit of the DDR synchronous memory device outputs data in synchronization with the rising and the falling edges of the system clock.

However, the system clock inputted to a memory device is delayed in being transferred to the data output circuit because the system clock is delayed by a clock input buffer, a transmission line, and etc. included in the memory device. Thus, if the data output circuit outputs data in synchronization with the delayed system clock, data that is out of sync with the rising and falling edges of the system clock is actually delivered into an external device receiving data outputted from the memory device.

To the above-mentioned feature, a semiconductor memory device includes a delay locked loop used for clock recovery (i.e., to preventing the system clock from being delayed). The delay locked loop is a circuit for compensating a delay time of the system block in delivering the system clock to the data output circuit from the time of being inputted to the semiconductor memory device. The delay locked loop recognizes a delay time through a clock input buffer, a transmission line, and etc. included in the semiconductor memory device, recovers the system clock based on the delay time, and outputs the recovered system clock to the data output circuit. Here, using the delay locked loop, a delay time of a system clock inputted to the semiconductor memory device is controlled and delivered to the data output circuit. Thus, the data output circuit outputs data in synchronization with the recovered system clock, and an external circuit recognizes that outputted data is synchronized with a system clock.

In operation, a delay locked clock outputted from a delay locked loop is delivered to an output buffer one cycle earlier than the timing of outputting data. The output buffer synchronizes data with the delivered clock to output data to an external device. This means that data is outputted earlier than a system clock by a delay time of internal circuits. Through this operation, outside of the semiconductor memory device, data is accurately outputted in synchronization with each of rising and falling edges of the system clock inputted to the semiconductor memory device. The delay locked loop is a circuit configured to determine how much earlier than a system clock data is outputted to compensate for a delay time of the system clock inside the semiconductor memory device.

Thus, the delay locked loop includes a delay unit configured to delay inputted clock signal. However, since the delay unit included in the delay locked loop has a maximum delay value, a delay locking operation may not be performed properly if the delay unit is to delay the inputted clock by a delay greater than the maximum value. This issue can arise in a case that, while an inputted clock has a long cycle period, the maximum delay value of the delay unit is not increased.

SUMMARY OF THE INVENTION

An embodiment of the present invention is directed to a delay locked loop having a wide operating frequency.

In accordance with an embodiment of the present invention, a semiconductor device includes a delay unit configured to delay an inputted clock to generate a delay clock, a selection unit configured to select and output one of the inputted clock and the delay clock, a delay locked loop configured to perform a delay locking operation using a signal delivered from the selection unit, and a selection control unit configured to control the selection unit in response to a comparison of one period of the inputted clock and a maximum delay value of the delay locked loop.

In accordance with another embodiment of the present invention, a method for performing a delay locked operation in a semiconductor device includes delaying an inputted clock to generate a first clock; delaying, with an adjustable delay unit, the inputted clock by the maximum delay value to generate a delayed clock; delaying the delayed clock, with a delay model unit, to generate a feedback clock; determining whether a transition timing of the feedback clock is within a single period of the inputted clock to output a timing result; and performing an adjustable delay operation by selecting the inputted clock or using the first clock in response to the timing result.

In accordance with another embodiment of the present invention, a method for performing a delay locked operation in a semiconductor device includes delaying an inputted clock by a replica delay unit and an adjustable delay unit to generate a feedback, comparing a transition time of the inputted clock and a transition time of the feedback clock, delaying the inputted clock by a predetermined delay value according to the comparing result, and performing a delay locking operation with the delayed and inputted clock.

DESCRIPTION OF SPECIFIC EMBODIMENTS

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
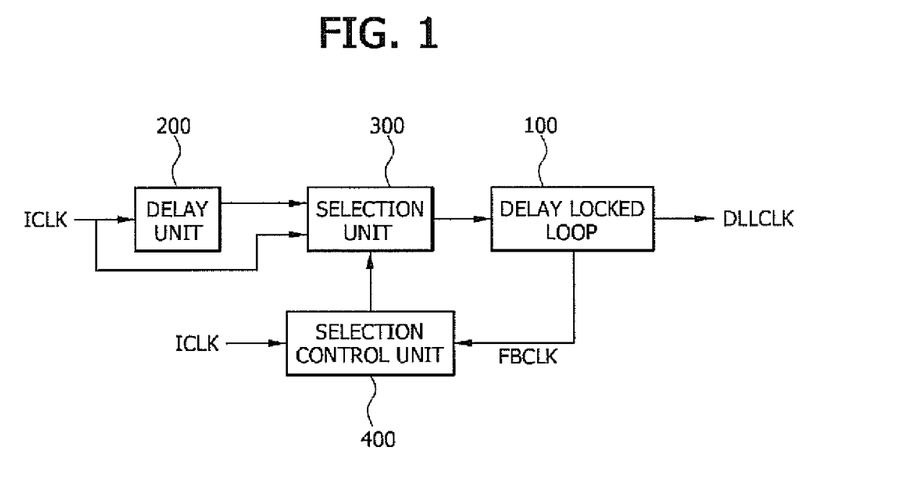
FIG. 1 is a block diagram showing a semiconductor device in accordance with an embodiment of the present invention.

FIG. 1 is a block diagram showing a semiconductor device in accordance with an embodiment of the present invention.

As shown, the semiconductor device includes a delay locked loop 100, a delay unit 200, a selection unit 300, and a selection control unit 400.

The delay locked loop 100 generates a feedback clock FBCLK delayed by a replica delay unit included in the delay locked loop 100, compares a phase of the feedback clock FBCLK with that of clock which is made from delaying the inputted clock ICLK by an adjustable delay value, and outputs a delay locked clock. The delay unit 200 delays the inputted clock ICLK by a desired time. The selection unit 300 selects one of clock provided by the delay unit 200 and the inputted clock ICLK and delivers the selected one into the delay locked loop 100. The selection control unit 400 compares the phase of the feedback clock FBCLK with that of the inputted clock ICLK and controls whether the selection unit 300 outputs the feedback clock FBCLK or the inputted clock ICLK.

Here, in a delay locked loop, an inputted reference clock is delayed at an adjustable delay unit by a desired time, and the delayed clock is delayed again at a replica delay unit by a replica delay value in producing a feedback clock. The replica delay value means the amount of time it takes to make a system clock pass through internal blocks and clock paths in a semiconductor device. A phase comparison unit compares a phase of the feedback clock FBCLK with that of the reference clock and adjusts delay value of the adjustable delay unit until the phases of the feedback clock FBCLK and the reference clock match. When the delay value of the adjustable delay unit is set to a particular value so that the phases of the feedback clock FBCLK and the reference clock match, a semiconductor enters a delay locked state. In the delay locked state, an outputted clock of the adjustable delay unit is a delay locked clock DLLCLK. The semiconductor device outputs data in synchronization with the delay locked clock DLLCLK. However, if the adjustable delay unit has the maximum delay value shorter than a single period of the reference clock, the delay locked state may not be achieved even with an adjustment of a delay value of the adjustable delay unit.

To address the above described feature, a semiconductor device according to an embodiment of the present invention includes a delay unit, a selection unit and a selection control unit.

The delay unit 200 delays an inputted clock ICLK by a desired delay value and outputs the delayed clock. The desired delay value is equal to or less than the maximum value of the adjustable delay unit in the delay locked loop 100. The selection unit 300 selects one of the inputted clock ICLK and the delayed clock outputted from the delay unit 200 and outputs the selected one to the delay locked loop 100.

The selection control unit 400 compares a phase of the inputted clock ICLK with that of the feedback clock FBCLK of the delay locked loop 100 and controls the selection unit 300 in response to the comparison result. At this time, the feedback clock FBCLK is a clock signal provided by the delay locked loop 100 in which the adjustable delay unit delays an inputted signal by the maximum delay value. For example, in an initial operation mode, the delay locked loop 100 delays an inputted clock by the maximum value and passes a delayed clock through a replica delay unit to generate the feedback clock FBCLK.

If a rising edge of the feedback clock FBCLK occurs within a single period of the inputted clock ICLK, the delay locked loop 100 does not enter a delay locked state. That is, if a clock delayed by the maximum value at the adjustable delay unit does not exceed a single period of the inputted clock, the delay locked state cannot be achieved no matter how a delay value of the adjustable delay is changed. Typically, this case occurs in a low frequency operation when a period of clock is longer or in a test operation. Accordingly, if a rising edge of the feedback clock FBCLK does not occur within a single period of the inputted clock ICLK, the selection control unit 400 controls the selection unit 300 to deliver a clock signal outputted from the delay unit 200 into the delay locked loop 100.

If a rising edge of the feedback clock FBCLK occurs only after a single period of the inputted clock, the delay locked loop 100 can achieve a delay locked state. In this case, the selection control unit 400 controls the selection unit 300 to deliver the inputted clock ICLK to the delay locked loop 100. To detect whether a rising edge of the feedback clock FBCLK is within one period of the inputted clock ICLK, it is checked whether the rising edge of the feedback clock FBCLK occurs earlier than the second transition of the inputted clock ICLK.

There is a limit to the maximum delay value of the adjustable delay unit included in the delay locked loop 100. To enable high speed operation of semiconductor devices, a "bang-bang" jitter in a delayed locked loop is to be reduced, where the delay locked loop does not adjust a delay value for generating a delay locked clock more minutely or finely than a delay value of a single unit delay element. It is called a bang-bang jitter in that the exact delayed locked state may not be achieved in a semiconductor device because a phase of the delay locked clock is shifted by the delay value of a single unit delay element.

To reduce effect of bang-bang jitter, a delay value of single unit delay element is to be minimized/reduced. However, if the delay value of single unit delay element is minimized, the maximum delay value of the adjustable delay unit might be decreased because there is a limit to the maximum number of unit delay elements included in the adjustable delay unit. If the maximum delay value of the adjustable delay unit is decreased, the delay locked loop 100 operates in a low frequency.

In an embodiment of the present invention, a semiconductor device includes a delay unit and a selection unit to address the above described features. In a low frequency, a period of the inputted clock is relatively long. However, even if the delay amount including the maximum delay value of adjustable delay unit and the delay value of replica delay unit is less than a period of inputted clock, the semiconductor device can operate a delay locked operation without errors because the delay locked loop operates using a clock delayed by a desired delay value at the delay unit.

Also, because the clock delayed by the desired delay value at the delay unit is used for a delay locked operation, the semiconductor device can reach the delay locked state faster than without the delay unit.

Hereinafter, referring to FIGS. 2 to 6, a structure and operation of a semiconductor device according to an embodiment is described.

Figure 2:
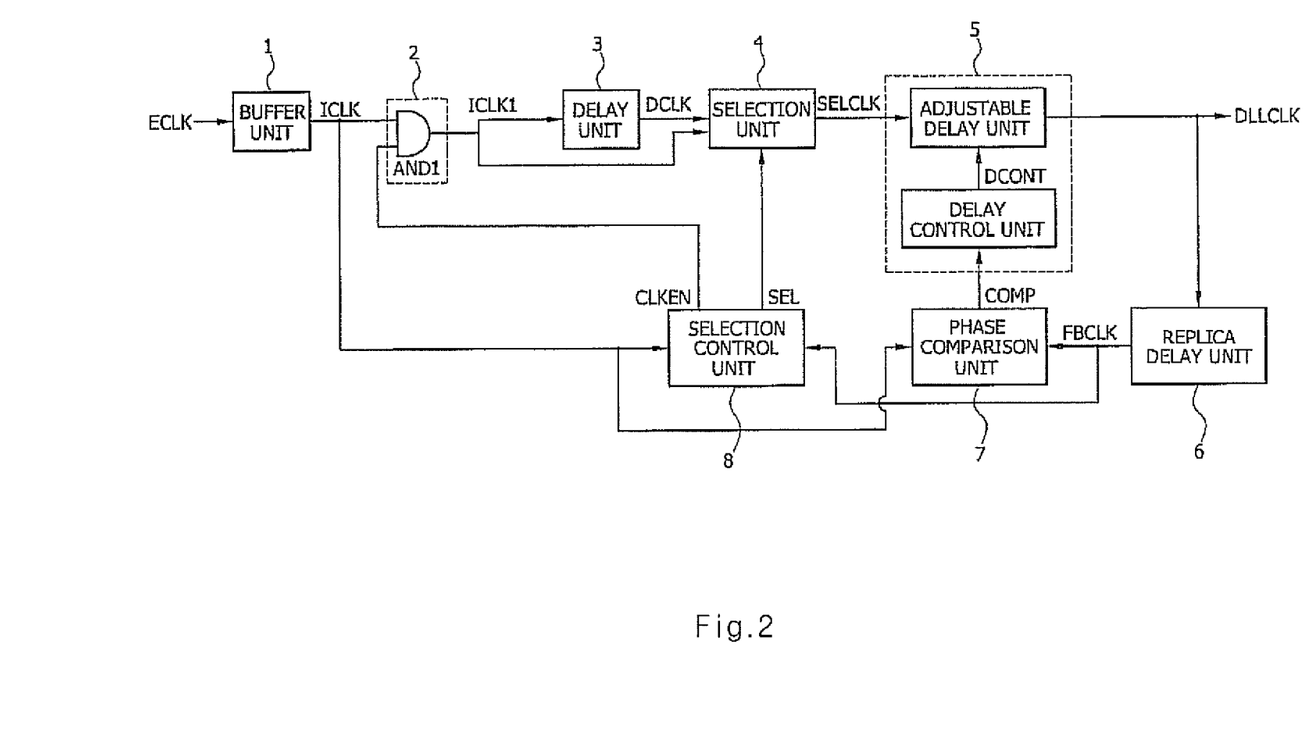
FIG. 2 is a block diagram illustrating detailed structure of the semiconductor device shown in FIG. 1.

FIG. 2 is a block diagram illustrating detailed structure of the semiconductor device shown in FIG. 1.

As shown, the semiconductor device includes a buffer unit 1, an enable unit 2, a delay unit 3, a selection unit 4, an adjustable delay block 5, a replica delay unit 6, a phase comparison unit 7, and a selection control unit 8. Here, according to an example, the adjustable delay block 5, the replica delay unit 6 and the phase comparison unit 7 are included in the delay locked loop 100 shown in FIG. 1. Also, the selection control unit 8, the selection unit 4 and the delay unit 3 may correspond to the selection control unit 400, the selection unit 300 and the delay unit 200 in FIG. 1, respectively.

The buffer unit 1 receives an external clock ECLK to generate an internal clock ICLK. The buffer unit 1 may include plural inverters serially connected to each other or a differential amplifier.

The enable unit 2 determines transmission of the internal clock ICLK in response to an enable signal CLKEN. The enable unit 2 includes a logic AND gate AND1 receiving the internal clock ICLK and the enable signal CLKEN. The enable signal CLKEN is generated for protecting the internal clock ICLK from a glitch, i.e., distortion on the leading or trailing edge of a pulse. Hereafter, an output signal of the enable unit 2 is called a first internal clock ICLK1.

The delay unit 3 delays the first internal clock ICLK1 to generate a delayed clock DCLK. The delay unit 3 includes an inverter chain or a delay circuit including a resister and a capacitor. Also, the delay unit 3 can be selectively turned on or off in response to the selection control unit 8. For example, when the delay unit 3 does not operate, the semiconductor device turns it off for reducing power consumption.

The selection unit 4 outputs, in response to a selection signal SEL, one of the delayed clock DCLK and the first internal clock ICLK1 as a selected clock SELCLK. The selection unit 4 may include a switching element such as a transfer gate, a multiplexer, and etc.

The adjustable delay block 5 delays the selected clock SELCLK in response to a comparison result signal COMP to generate a delay locked clock DLLCLK. The adjustable delay block 5 includes an adjustable delay unit configured to delay the selected clock SELCLK according to a delay time control signal DCONT to generate the delay locked clock DLLCLK, and a delay control unit configured to generate the delay time control signal DCONT deciding a delay time of the adjustable delay unit in response to the comparison result signal COMP. The adjustable delay unit includes plural delay circuits having a fine delay control to reduce a jitter effect of the delay locked clock DLLCLK.

The replica delay unit 6 delays the delay locked clock DLLCLK by a desired delay value to generate a feedback clock FBCLK. The desired delay value of the replica delay unit 6 is the sum of delay times of the buffer unit 1 and an output buffer (not shown) to receive/output the delay locked clock DLLCLK.

The phase comparison unit 7 compares a phase of the first internal clock ICLK1 with that of the feedback clock FBCLK to generate the comparison result signal COMP. If the first internal clock ICLK1 is earlier in phrase than the feedback signal FBCLK, the comparison result signal COMP has a logic high level. Otherwise, if the feedback signal FBCLK is earlier in phase than the first internal clock ICLK1, the comparison result signal COMP has a logic low level. According to which one of two logic levels that the comparison result signal COMP has, the delay control circuit 5 controls a delay time of the adjustable delay unit.

The selection control unit 8 compares a phase of the internal clock ICLK1 with that of the feedback clock FBCLK to generate a selection signal SEL. The selection signal SEL transits to a logic high level if a rising edge of the feedback clock FBCLK occurs between two rising edges of the first internal clock ICLK1. Otherwise, the selection signal SEL transits to a logic low level if any rising edge of the feedback clock FBCLK does not occur while two rising edges of the first internal clock ICLK1 occur. Also, the selection control unit 8 generates an enable signal CLKEN in response to the first internal clock ICLK1. That is, the selection control unit 8 activates the enable signal CLKEN as a logic low level while the first internal clock ICLK1 is generated.

Figure 3:
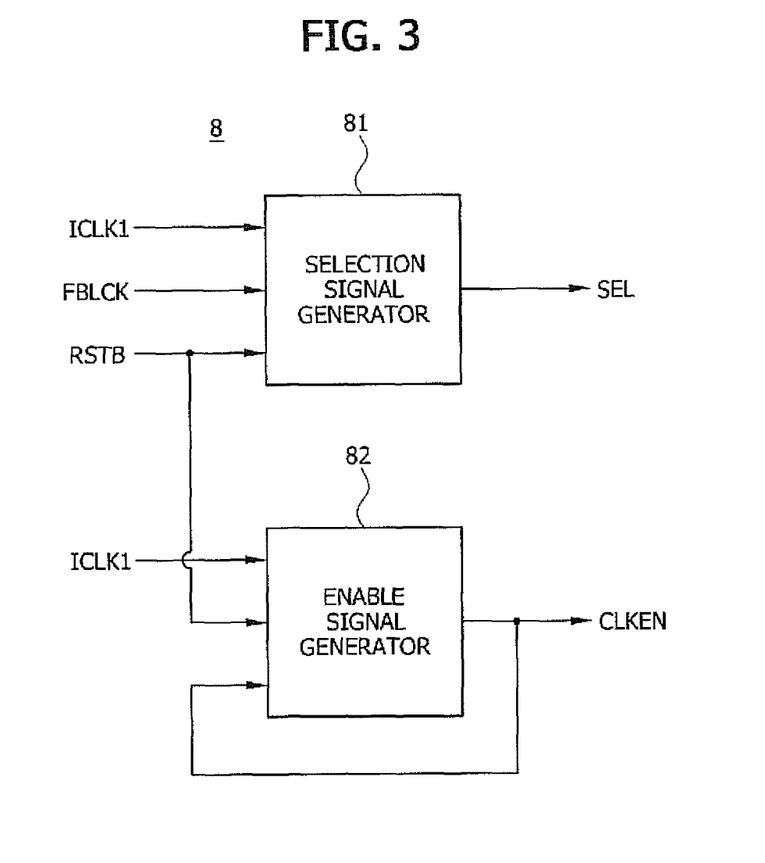
FIG. 3 is a block diagram illustrating a selection control unit shown in FIG. 2.

FIG. 3 is a block diagram illustrating a selection control unit 8 shown in FIG. 2.

As shown, the selection control unit 8 includes a selection signal generator 81 configured to generate the selection signal SEL in response to the first internal clock ICLK1, the feedback clock FBCLK and a reset signal RSTB, and an enable signal generator 82 configured to generate the enable signal CLKEN in response to the first internal clock ICLK1 and the reset signal RSTB.

Figure 4:
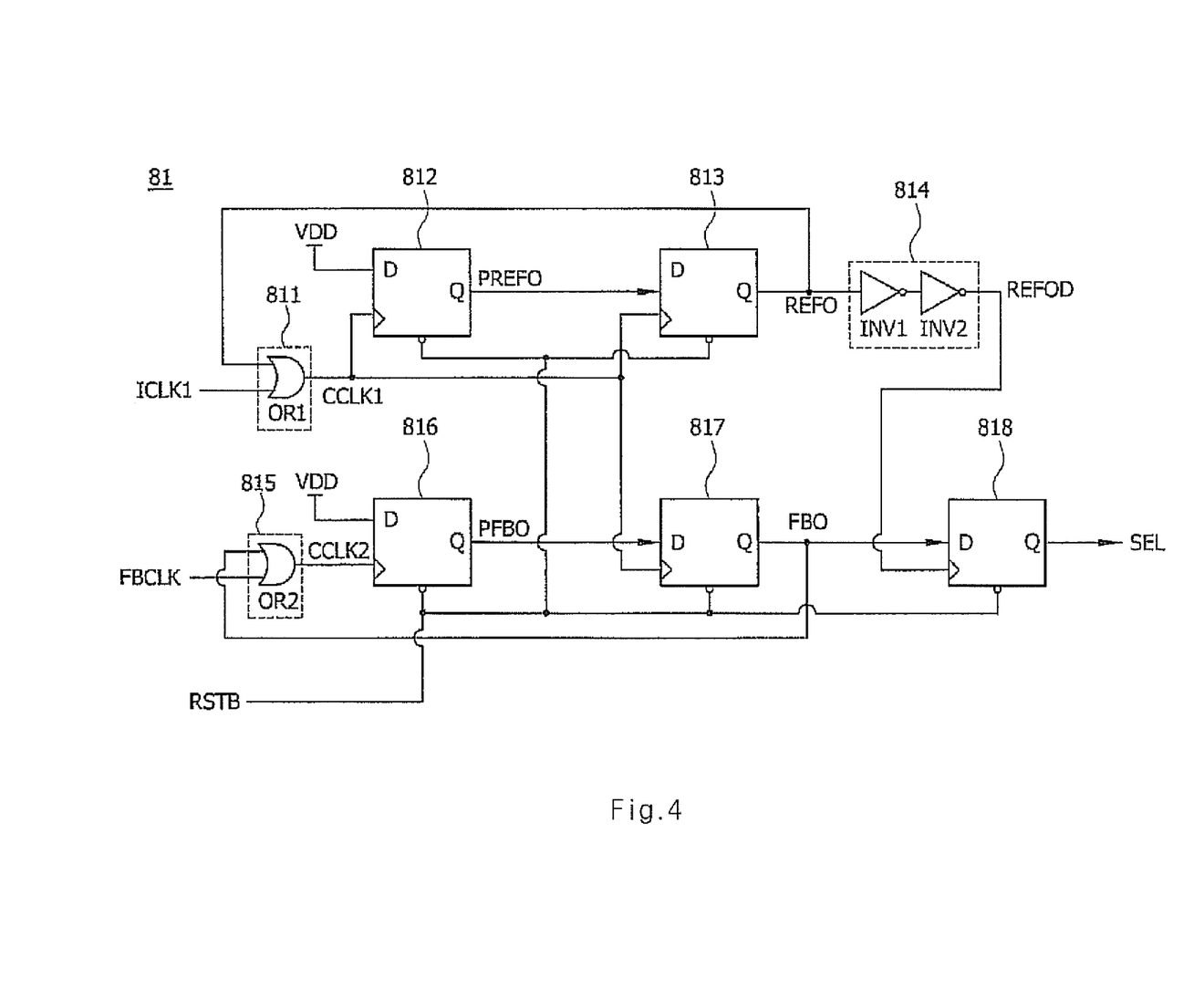
FIG. 4 is a circuit diagram illustrating a selection signal generator shown in FIG. 3.

FIG. 4 is a circuit diagram illustrating a selection signal generator 81 shown in FIG. 3.

As shown, the selection signal generator 81 includes a first control clock generating block 811, a first synchronization block 812, a second synchronization block 813, a unit delay block 814, a second control clock generating block 815, a third synchronization block 816, a fourth synchronization block 817, and a fifth synchronization block 818.

The first control clock generating block 811 generates a first control clock CCLK1 for controlling the timing of outputting a signal from the first synchronization block 812, the second synchronization block 813, and the fourth synchronization block 817. The first control clock CCLK1 is toggled in synchronization with the first internal clock ICLK1 while a second synchronization signal REF0 is activated. The first control clock generating block 811 is reset in response to a reset signal RSTB provided in the semiconductor device. To perform a reset operation, according to an example, the first control clock generating block 811 includes a first logic OR gate OR1 configured to perform a logic OR operation on the first internal clock ICLK1 and the second synchronization signal REF0.

The first synchronization block 812 shifts a power voltage VDD in response to the first control clock CCLK1 to generate a first synchronization signal PREF0. The first synchronization signal PREF0 can be activated as a logic high level at a first rising edge of the first internal clock ICLK1. The first synchronization block 812 is reset in response to the reset signal RSTB. To perform a reset operation, according to an example, the first synchronization block 812 includes a D flip-flop.

The second synchronization block 813, in response to the first control clock CCLK1, shifts the first synchronization signal PREF0 by a clock cycle, 1 tCK, of the first internal clock ICLK1 to generate the second synchronization signal REF0. The second synchronization block 813 is reset in response to the reset signal RSTB. To perform a reset operation, according to an example, the second synchronization block 813 includes a D flip-flop.

The unit delay block 814 delays the second synchronization signal REF0 to generate a third synchronization signal REF0D. For performing a delay operation, the unit delay block 814 can include two invertors INV1 and INV2 that are serially connected. The unit delay block 814 may include more than two inverters according to a desired delay time.

The second control clock generating block 815 generates a second control clock CCLK2 for controlling the timing of outputting a signal from the third synchronization block 816. The second control clock CCLK2 is toggled in synchronization with the feedback clock FBCLK when a fifth synchronization signal FB0 is activated. The second control clock generating block 815 is reset in response to a reset signal RSTB provided in the semiconductor device. To perform a reset operation, according to an example, the second control clock generating block 815 includes a second logic OR gate OR2 configured to perform a logic OR operation to the feedback clock FBCLK and the fifth synchronization signal FB0.

The third synchronization block 816, in response to the second control clock CCLK2, shifts a power voltage VDD to generate a fourth synchronization signal PFB0. The fourth synchronization signal PFB0 can be activated as a logic high level at a first rising edge of the feedback clock FBCLK. The third synchronization block 816 is reset in response to the reset signal RSTB. To perform a reset operation, the third synchronization block 816 can include a D flip-flop.

The fourth synchronization block 817, in response to the first control clock CCLK1, shifts the fourth synchronization signal PFB0 to generate the fifth synchronization signal PFB0. The fourth synchronization block 817 is reset in response to the reset signal RSTB. To perform reset operation, according to an example, the fourth synchronization block 817 includes a D flip-flop.

The fifth synchronization block 818, in response to the third synchronization signal REF0D, shifts the fifth synchronization signal FB0 to generate the selection signal SEL. The fifth synchronization block 818 is reset in response to the reset signal RSTB. To perform a reset operation, the fifth synchronization block 818 can include a D flip-flop.

After comparing the phase of the first initial clock ICLK1 with that of the feedback clock FBCLK, the selection control unit 8 described above generates the selection signal SEL. As a result, the selection signal generator 81 activates the selection signal SEL as a logic high level or inactivates it, according to whether a rising edge of the feedback clock FBCLK occurs during one cycle of the first internal clock ICLK1, i.e., while the first internal clock ICLK1 transitions two times.

Figure 5:
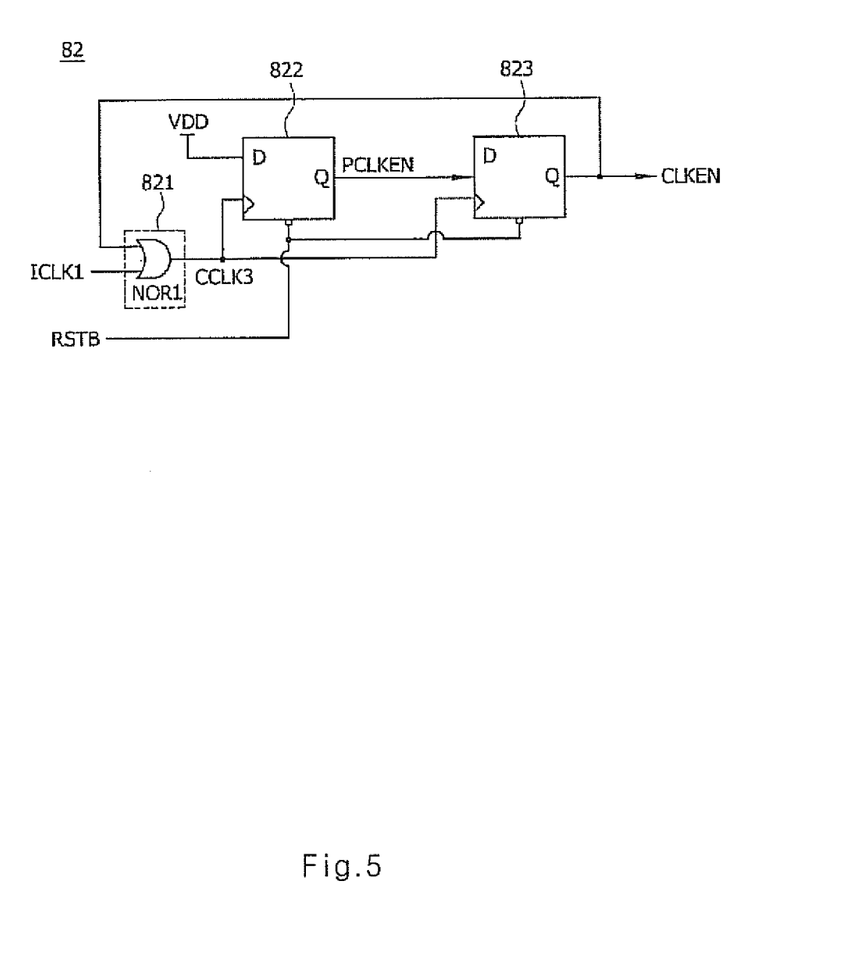
FIG. 5 is a circuit diagram showing an enable signal generator shown in FIG. 3.

FIG. 5 is a circuit diagram showing an enable signal generator 82 shown in FIG. 3.

As shown, the enable signal generator 82 includes a third control clock generating unit 821, a sixth synchronization unit 822, and a seventh synchronization 823.

The third control clock generating unit 821 generates a third control clock CCLK3 for controlling the timing of outputting a signal from the sixth and the seventh synchronization blocks 822 and 823. The third control clock CCLK3 is toggled in synchronization with the internal clock ICLK while the enable signal CLKEN is activated. The third control clock generating block 821 is reset in response to a reset signal RSTB provided in the semiconductor device. To perform a reset operation, according to an example, the third control clock generating block 821 includes a first logic NOR gate NOR1 configured to perform a logic NOR operation to the internal clock ICLK and the enable signal CKLEN.

The sixth synchronization unit 822 outputs a sixth synchronization signal PCLKEN in response to the third control clock CCLK3. The sixth synchronization signal PCLKEN can be activated as a logic high level in synchronization with a first rising edge of the first internal clock ICLK. The sixth synchronization block 822 is reset in response to the reset signal RSTB. To perform a reset operation, according to an example, the sixth synchronization block 822 includes a D flip-flop.

The seventh synchronization 823, in response to the third control clock CCLK3, shifts the fifth synchronization signal FB0 by 1 tCK of the internal clock ICLK to generate the enable signal CLKEN. The seventh synchronization block 823 is reset in response to the reset signal RSTB. To perform a reset operation, according to an example, the seventh synchronization block 823 includes a D flip-flop.

Detailed operation of the delay locked loop described above is described below.

Figure 6A:
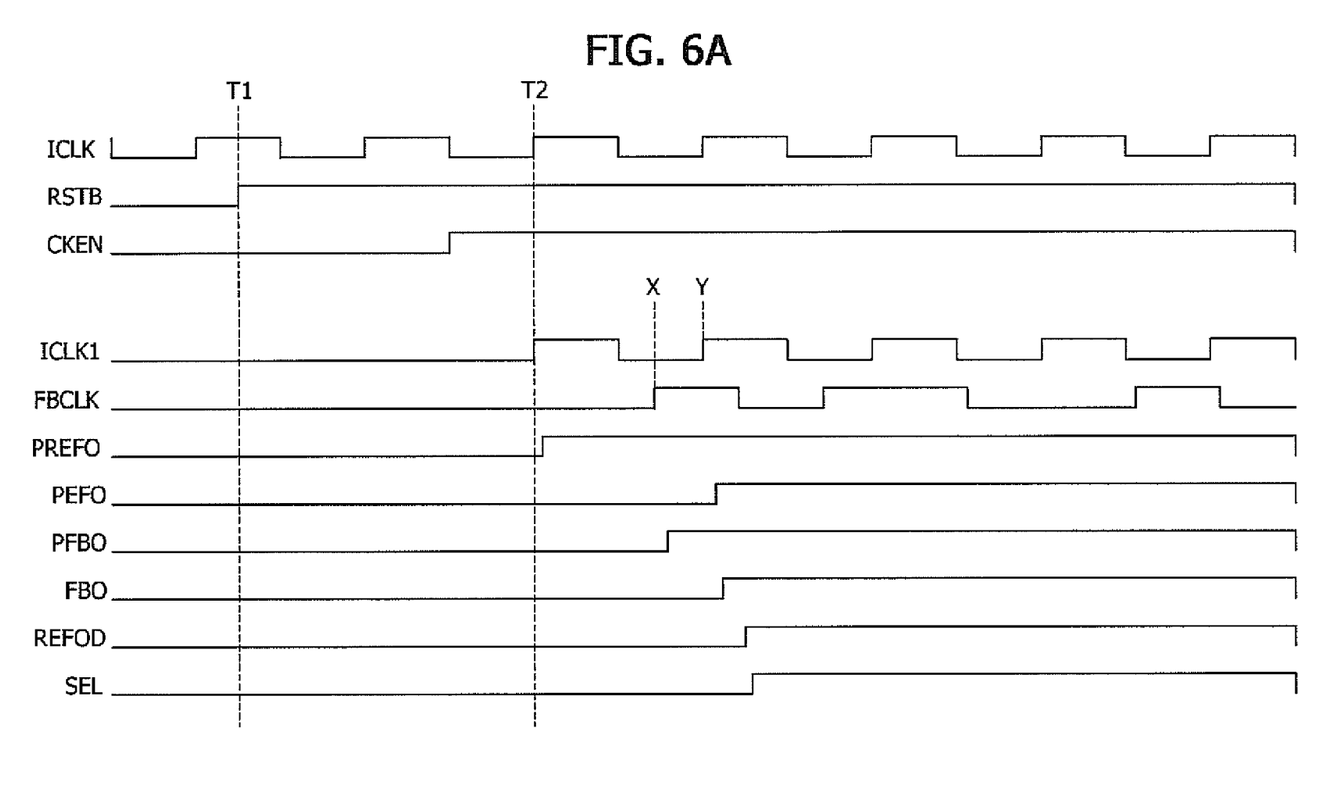
FIGS. 6A and 6B are timing diagrams illustrating an operation of a delay locked loop shown in FIGS. 1 to 5.
Figure 6B:
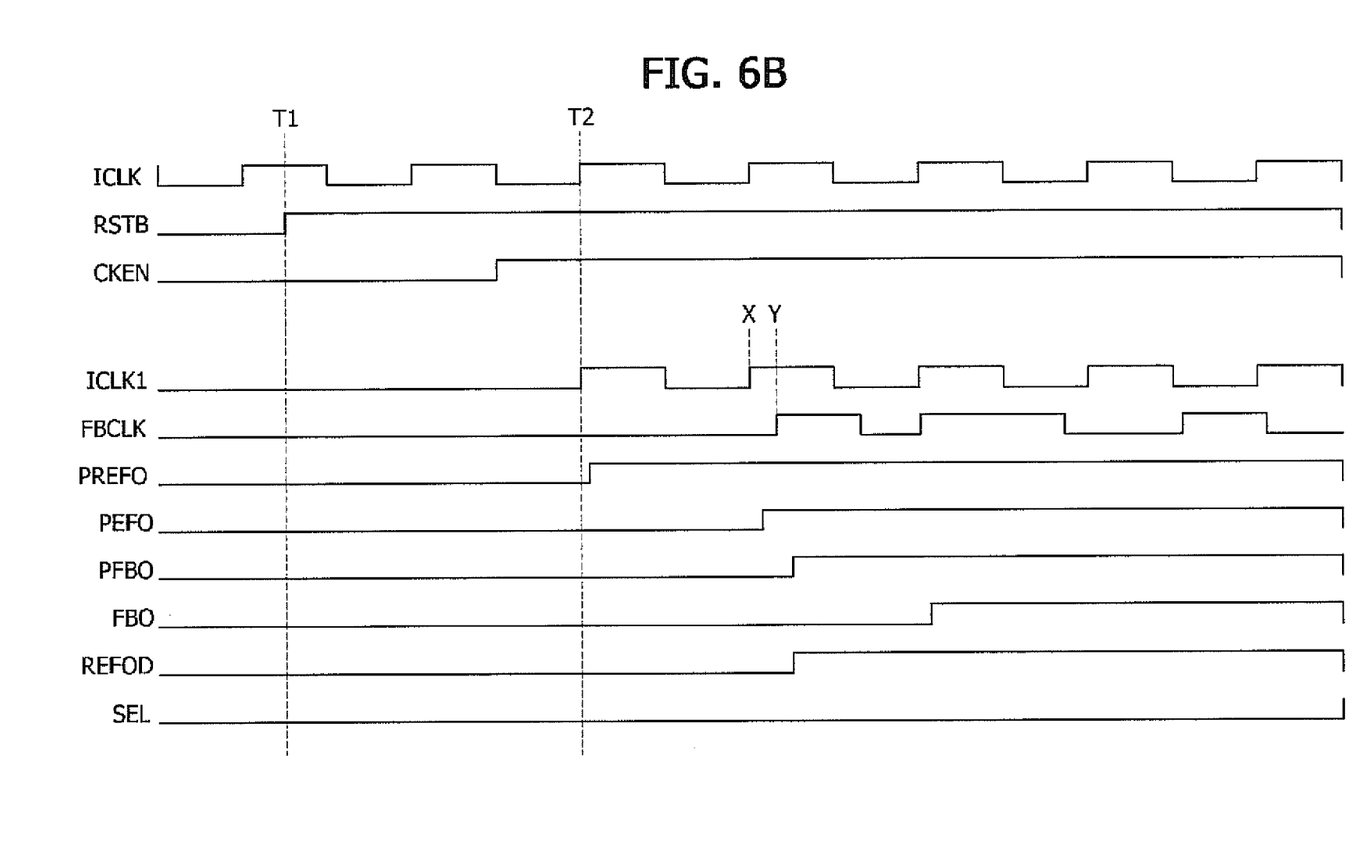

FIGS. 6A and 6B are timing diagrams illustrating an operation of delay locked loop shown in FIGS. 1 to 5. While FIG. 6a is the timing diagram illustrating operation of the delay locked loop in a low operation frequency, FIG. 6B shows an operation of the delay locked loop in a high operation frequency.

Referring to FIG. 6A, an external clock ECLK is buffered to generate the internal clock ICLK. If the reset signal RSTB is inactivated at the timing of T1, the enable signal generator 82 generates the enable signal CLKEN at the second falling edge of the internal clock ICLK. Accordingly, the enable unit 2 outputs the first internal clock ICLK1 at the timing T2.

If the first internal clock ICLK1 is generated, the selection unit 4 outputs the first internal clock ICLK1 as the selection clock SELCLK. The adjustable delay unit delays the section clock SELCLK by the maximum delay value to generate the delay locked clock DLLCLK. Thereafter, the replica delay unit 6 delays the delay locked clock DLLCLK to generate the feedback clock FBCLK.

The selection control unit 8 checks whether a rising edge of the feedback clock FBCLK occurs within two rising edges of the first internal clock, to generate the selection signal SEL. In detail, the selection control unit 8 uses following three signals: the first synchronization signal PREF0 activated at the first rising edge of the first internal clock ICLK1; the second synchronization signal REF0 activated at the second rising edge of the first internal clock ICLK1; and the fourth synchronization signal FPB0 activated at the first rising edge of the feedback clock FBCLK. The selection signal SEL is generated according to whether the fourth synchronization signal FPB0 is activated or not from the activation timing of the first synchronization signal PREF0 to the activation timing of the fourth synchronization signal FPB0.

Here, if the fourth synchronization signal FPB0 is activated within the above-described period, the selection signal SEL at a low frequency operation is activated as a logic high level. In FIG. 6A, a transition timing X of the feedback clock FBCLK is within one cycle Y, i.e., period between two rising edges, of the first internal clock ICLK1. In this case, the delay unit 3 is enabled, so a clock delayed at the delay unit 3 is selected by the selection unit 4 and transferred to the adjustable delay block 5.

Referring to FIG. 6B, the external clock ECLK is buffered to generate the internal clock ICLK. If the reset signal RSTB is inactivated at the timing of T1, the enable signal generator 82 generates the enable signal CLKEN at the second falling edge of the internal clock ICLK. Accordingly, the enable unit 2 outputs the first internal clock ICLK1 at the timing of T2.

If the first internal clock ICLK1 is generated, the selection unit 4 outputs the first internal clock ICLK1 as the selection clock SELCLK. The adjustable delay block 5 delayed the section clock SELCLK by the maximum delay value to generate the delay locked clock DLLCLK. Thereafter, the replica delay unit 6 delays the delay locked clock DLLCLK to generate the feedback clock FBCLK.

The selection control unit 8 checks whether a rising edge of the feedback clock FBCLK occurs between two rising edges of the first internal clock to generate the selection signal SEL. In detail, the selection control unit 8 uses following three signals: the first synchronization signal PREF0 activated at the timing of the first rising edge of the first internal clock ICLK1; the second synchronization signal REF0 activated at the timing of the second rising edge of the first internal clock ICLK1; and the fourth synchronization signal FPB0 activated at the timing of the first rising edge of the feedback clock FBCLK. The selection signal SEL is generated according to whether the fourth synchronization signal FPB0 is activated, or not, from the activation timing of the first synchronization signal PREF0 to the activation timing of the fourth synchronization signal FPB0.

Here, if the fourth synchronization signal FPB0 is not activated within the above-described period, the selection signal SEL in a high frequency operation is inactivated as a logic low level. Thus, the delay locked loop performs the delay locked operation using only the adjustable delay block 5 and the replica delay unit 6 without the delay unit 3. In FIG. 6B, a transition timing X of the feedback clock FBCLK is outside of one cycle Y, i.e., period of two rising edges, of the first internal clock ICLK1. In this case, the delay unit 3 is disabled, so that the first internal clock ICLK1 is selected by the selection unit 4 and transferred to the adjustable delay block 5.

In the semiconductor device according to an embodiment, it is first determined whether the first internal clock ICLK1 can be delayed by 1 tCK using both the delay value of the replica delay unit and the maximum delay value of the adjustable delay unit; and if the first internal clock ICLK 1 is not delayed by 1 tCK, another internal clock additionally delayed by a desired delay value is used for the delay locked operation.

In the semiconductor device according to an embodiment, though a delay unit value in the adjustable delay unit is minimized in order to reduce a bang-bang jitter effect, a delay margin of inputted clock or an operational clock can increase (i.e., become wide). For example, even if the semiconductor device is designed for the operation clock of which a period is in a range of 0.5 n to 3 n second, the semiconductor device can reliably perform a delay locked operation when an operation or test clock having a period of 5 n to 7 n second is inputted.

As discussed earlier, a semiconductor device in accordance with embodiments of the present invention has a wide operating frequency. Even though there are cases that an inputted clock signal has a long cycle period, or that the maximum value of adjustable delay unit in the delay locked loop is not sufficient, a delay locked operation can be performed without an error.

Further, according to exemplary embodiments of the present invention, a delay locking operation can be performed faster because the delay locking operation is performed after the clock signal is previously delayed by a desired delay value.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   an enable unit configured to determine whether an inputted clock is transmitted in response to an enable signal;
   a delay unit configured to delay the inputted clock to generate a delay clock;
   a selection unit configured to select and output one of the inputted clock and the delay clock;
   a delay locked loop configured to perform a delay locking operation using a signal outputted from the selection unit; and
   a selection control unit configured to control the selection unit in response to a comparison of one period of the inputted clock and a maximum delay value of the delay locked loop.

2. The semiconductor device as recited in claim 1, wherein the delay locked loop includes:
   an adjustable delay unit configured to delay the signal outputted from the selection unit in response to a control signal;
   a replica delay unit configured to delay an outputted clock of the adjustable delay unit by a replica delay to generate a feedback clock; and
   a phase comparison unit configured to compare a phase of the feedback clock with that of the inputted clock to output the control signal.

3. The semiconductor device as recited in claim 2, wherein the selection control unit is configured to check whether at least one rising edge of the feedback clock occurs between occurrences of two rising edges of the inputted clock.

4. The semiconductor device as recited in claim 2, wherein a delay value of the delay unit is equal to or smaller than the maximum value of the adjustable delay unit.

5. The semiconductor device as recited in claim 1, further comprising an enable signal generator configured to generate the enable signal in response to the inputted clock.

6. The semiconductor device as recited in claim 1, wherein the selection control unit includes:
   a first control clock generator configured to perform a logical OR operation on an internal clock and a second synchronization signal to generate a first control clock;
   a first synchronization unit configured to shift a power voltage in response to the first control clock to generate a first synchronization signal;
   a second synchronization unit configured to shift the first synchronization signal in response to the first control clock to generate the second synchronization signal;
   a unit delay configured to delay the second synchronization signal to output a third synchronization signal;
   a second control clock generator configured to perform a logical OR operation of a feedback clock and a fifth synchronization signal to generate a second control clock;
   a third synchronization unit configured to shift the power voltage in response to the second control clock to generate a fourth synchronization signal;
   a fourth synchronization unit configured to shift the fourth synchronization signal in response to the first control clock to generate the fifth synchronization signal;
   a fifth synchronization unit configured to shift the fifth synchronization signal in response to the third synchronization signal to generate a selection signal.

7. The semiconductor device as recited in claim 1, wherein the selection unit is configured to transmit an output of the delay unit during a test mode.

8. The semiconductor device as recited in claim 1, wherein, when a period of the inputted clock ranges from 5n second to 7n second, the selection unit is configured to transmit an output of the delay unit and, when the period of the inputted clock ranges from 0.5n second to 3n second, the selection unit is configured to transmit the inputted clock.

9. A method for performing a delay locked operation in a semiconductor device, comprising:
- determining, at an enable unit, whether an inputted clock is transmitted in response to an enable signal;
- delaying the inputted clock to generate a first clock;
- delaying, with an adjustable delay unit, the inputted clock by a maximum delay value to generate a delayed clock;
- delaying the delayed clock, with a delay model unit, to generate a feedback clock;
- determining whether a transition timing of the feedback clock is within a single period of the inputted clock to output a timing result; and
- performing an adjustable delay operation by selecting the inputted clock or the first clock in response to the timing result.

10. The method as recited in claim 9, wherein the timing result is outputted according to whether a rising edge of the feedback clock occurs between two transitions of the inputted clock.

11. The method as recited in claim 9, wherein a delay value of the inputted clock is equal to or smaller than the maximum value of the adjustable delay unit.

12. The method as recited in claim 11, wherein, when a period of the inputted clock ranges from 5 n second to 7 n second, the first clock is selected and when the period of the inputted clock ranges from 0.5 n second to 3n second, the inputted clock is selected.

* * * * *